United States Patent [19]
Bandic et al.

[11] Patent Number: 6,093,952
[45] Date of Patent: Jul. 25, 2000

[54] HIGHER POWER GALLIUM NITRIDE SCHOTTKY RECTIFIER

[75] Inventors: Zvonimir Z. Bandic, Pasadena; Eric C. Piquette, Newbury Park; Thomas C. McGill, Pasadena, all of Calif.

[73] Assignee: California Institute of Technology, Pasadena, Calif.

[21] Appl. No.: 09/283,009

[22] Filed: Mar. 31, 1999

Related U.S. Application Data

[60] Provisional application No. 60/080,638, Apr. 3, 1998.

[51] Int. Cl.[7] .................................................. H01L 27/095
[52] U.S. Cl. ............................. 257/485; 257/76; 257/472
[58] Field of Search .............................. 257/76, 472, 485

[56] References Cited

U.S. PATENT DOCUMENTS

| | | | |
|---|---|---|---|
| 5,210,051 | 5/1993 | Carter, Jr. .................................. | 437/107 |
| 5,990,531 | 5/1993 | Taskar et al. ............................ | 257/410 |

*Primary Examiner*—Olik Chaudhuri
*Assistant Examiner*—Douglas A. Wille
*Attorney, Agent, or Firm*—Fish & Richardson P.C.

[57] ABSTRACT

A Schottky high power rectifier having a nitride insulator formed on the surface of a GaN substrate. The nitride insulator increases the electric field breakdown suppression at or near the surface of the rectifier below the insulator. In a preferred embodiment, the nitride insulator is an epitaxially grown aluminum nitride insulator.

13 Claims, 2 Drawing Sheets

HIGHER POWER GALLIUM NITRIDE SCHOTTKY RECTIFIER

CROSS REFERENCE TO RELATED APPLICATIONS

This application claims the benefit of U.S. Provisional Application Ser. No. 60/080,638, filed on Apr. 3, 1998.

STATEMENT AS TO FEDERALLY SPONSORED RESEARCH

The U.S. Government has certain rights in this invention pursuant to Grant No. N00014-92-J-1845 awarded by the Navy.

FIELD OF THE INVENTION

The present invention relates to gallium nitride (GaN) rectifiers for high voltage and current applications.

BACKGROUND

Wide band gap materials, primarily silicon carbide (SiC) and gallium nitride (GaN) have recently become attractive substitutes to silicon in the construction of Schottky rectifiers for applications in high power and high temperature applications. Although the processing technology for SiC is more mature, in the context of Schottky rectification, GaN offers several advantages. A critical advantage is in higher electric field breakdown and efficient manner for suppression of surface electric field breakdown. The electric field breakdown and suppression of electric field breakdown are significant factors in the design of high power devices.

SUMMARY

The present disclosure describes a Schottky high power rectifier having a nitride insulator formed on the surface of a GaN substrate. The nitride insulator increases the electric field breakdown suppression at or near the surface of the rectifier below the insulator. In a preferred embodiment, the nitride insulator is an epitaxially grown aluminum nitride or aluminum gallium nitride.

DESCRIPTION OF THE PREFERRED EMBODIMENTS

Figure 1A:
FIGS. 1(A)–1(F) are a series of sectional views sequentially illustrating the steps of production of an exemplary embodiment of a Schottky rectifier in accordance with the present disclosure.

FIGS. 1(A)–1(F) show the sequential operation adopted to make a Schottky rectifier having improved breakdown resistance in accordance with a preferred embodiment. As illustrated in FIG. 1(A), the fabrication of the rectifier is initiated with a substrate 10 of semiconducting material made from a sapphire or a gallium nitride (GaN) wafer material. This material is first typically cleaned with organic solvents and then loaded into an epitaxial growth reactor. The epitaxial growth process may be Molecular Beam Epitaxy or Chemical Vapor Deposition or any known equivalent process.

Figure 1B:
Figure 1C:
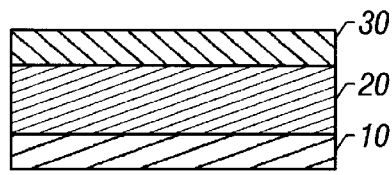
Figure 1D:
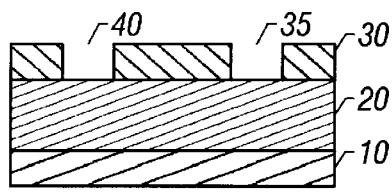
Figure 1E:
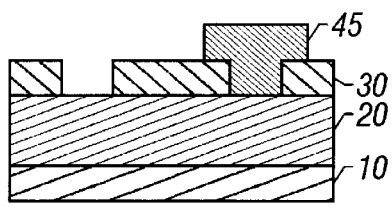
Figure 1F:
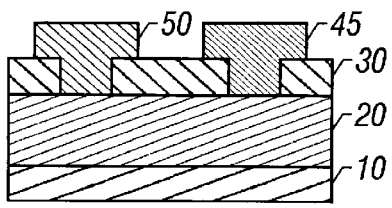

An GaN epitaxial film 20 is produced from such process, as illustrated in FIG. 1(B). The thickness of the epitaxial film is selected to support required maximum voltage properties of the rectifier. An insulator aluminum nitride (AlN) film 30 is then grown over the epitaxial film 20 in the growth reactor.

The inventors have found that the AlN film 30 passivates the surface of the GaN epitaxial film 20 to suppress surface breakdown even at reverse voltages as high as 25 kvolts and current values as great as 2 KAmperes and higher.

Once the AlN film 30 is formed, the sample is removed from the growth reactor chamber. Openings 35, 40 are then made in the AlN film 30 using conventional photolithographic patterning and etching techniques (FIG. 1(D)). An ohmic contact metal 45 is then formed by deposition and patterning in opening 35 (FIG. 1(E)). Deposition and patterning is then used to form a Schottky metal contact 50 in opening 40 using photolithography (FIG. 1(F)). The deposition of the metal contacts 45, 50 are formed in a liftoff type step in a known manner.

In an alternative construction, the metal contacts 45, 50 are laid down first. The AlN film is then deposited (by regrowth or sputter deposition) and patterned by liftoff.

Figure 2:
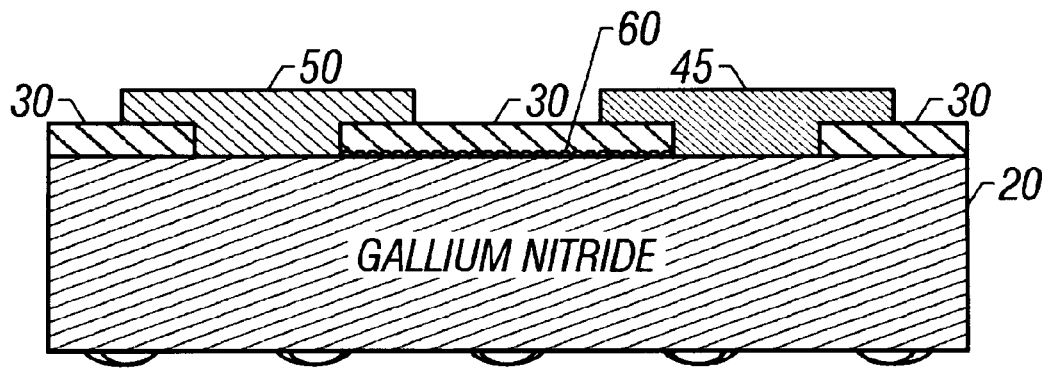
FIG. 2 is an enlarged sectional view of the Schottky rectifier in FIG. 1(F) with the electric field breakdown region shown in dotted lines.

A surface portion 60, shown in dotted lines in FIG. 2, represents an electric field region at or near the surface of the GaN epitaxial film 20. This surface portion 60 is the portion of the GaN film most susceptible to breakdown in response to a very high reverse voltage or current applied to the Schottky contact. The voltage/current withstanding capability of the Schottky rectifier with AlN insulator film 30 is found to be substantially greater than a conventional GaN Schottky formed without this layer. As can be seen, the breakdown region is initiated at or near the surface of the GaN film 20. When the voltage/current withstand capability is exceeded, the Schottky rectifier device can become physically damaged, as typically may be evidenced by holes or cracks on the surface of the GaN film. The AlN film 30 thus increases this withstanding capability.

The illustrative embodiment uses AlN as the epitaxially grown insulator film. It should be understood, however, that other nitrides, including aluminum gallium nitride, may also be used.

The chemical properties of AlN and GaN materials are such that in addition to both being nitrides, growth of one on the other is done cleanly and easily. Thus, cost of manufacture is low and yield high.

Silicon and silicon carbide type rectifiers have a surface chemistry that is incompatible with that of an aluminum nitride epitaxially grown film. Accordingly, such devices would not realize any voltage withstand capability benefit from having the AlN film epitaxial film grown on a surface thereof. Indeed, the benefits of the preferred embodiments are realized by virtue of the chemical compatibility of the GaN and AlN nitride materials during the growth process.

Another disadvantage of silicon and silicon carbide rectifiers is that such materials cannot be effectively electrically isolated. A sapphire wafer, on the other hand, which is characteristically non-conductive, allows for fabrication of multiple high power components on a single substrate. This makes it possible to have multiply-coupled rectifiers on a single chip. Alternatively, one or more rectifiers may be fabricated on a single substrate as part of a high power integrated circuit.

It should be appreciated that while FIGS. 1 and 2 show only a single rectifier device, a plurality of such devices may be formed simultaneously on a single wafer and then diced to yield individual components.

A Schottky rectifier device, as explained above, will have its surface and vertical geometry determined as a function of at least the desired voltage/current withstanding capabilities in the environment in which such device is to be employed. It is contemplated that a typical size top planar cross-sectional area of a typical Schottky device constructed in accordance with the present disclosure might be approximately between 1 and 10 $cm^2$.

A high power Schottky rectifier constructed as described herein was shown to have an applicable reverse voltage withstand capability in the approximate range between 5 kVolts and 25 kVolts, and a current withstand capability in the approximate range of 200 to 2 KAmperes.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high power Schottky rectifier comprising:
   a substrate;
   a gallium nitride epitaxial film grown over the substrate including a surface portion of a type that is susceptible to surface breakdown; and
   a nitride insulator film, formed over the surface portion to suppress surface breakdown in the surface portion.

2. The high power Schottky rectifier of claim 1, wherein the nitride insulator film is one of an aluminum nitride film and aluminum gallium nitride film.

3. The high power Schottky rectifier of claim 2, wherein the nitride insulator film is an epitaxially grown film.

4. The high power Schottky rectifier of claim 3, further comprising a Schottky contact and an ohmic contact disposed in openings through the nitride insulator film extending to a surface of the gallium nitride epitaxial film on either side of the surface portion thereof susceptible to breakdown.

5. The high power Schottky rectifier of claim 4, wherein the rectifier has a planar cross-sectional area approximately between 1 and 10 $cm^2$.

6. The high power Schottky rectifier of claim 5, wherein the rectifier has a reverse voltage withstand capability in the approximate range between 5 kVolts and 25 kVolts.

7. The high power Schottky rectifier of claim 5, wherein the rectifier has a current withstand capability in the approximate range between 200 and 2000 Amperes.

8. The high power Schottky rectifier of claim 1, wherein the substrate is sapphire.

9. The high power Schottky rectifier of claim 1, wherein the substrate is a gallium nitride material.

10. The high power Schottky rectifier of claim 1, further comprising a Schottky contact and an ohmic contact disposed in openings through the nitride insulator film extending to a surface of the gallium nitride epitaxial film on either side of the surface portion thereof susceptible to breakdown.

11. The high power Schottky rectifier of claim 1, wherein the rectifier has a planar cross-sectional area approximately between 1 and 10 $cm^2$.

12. The high power Schottky rectifier of claim 1, wherein the rectifier has a reverse voltage withstand capability in the approximate range between 5 kvolts and 25 kVolts.

13. The high power Schottky rectifier of claim 1, wherein the rectifier has a current withstand capability in the approximate range between 200 and 2000 Amperes.

* * * * *